United States Patent
Jessie et al.

(10) Patent No.: US 9,537,197 B2
(45) Date of Patent: Jan. 3, 2017

(54) TRANSMISSION LINE IMPLEMENTATION IN WAFER-LEVEL PACKAGING

(71) Applicant: QUALCOMM Incorporated, San Diego, CA (US)

(72) Inventors: Darryl Jessie, San Diego, CA (US); Lan Nan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 14/559,503

(22) Filed: Dec. 3, 2014

(65) Prior Publication Data

US 2016/0164158 A1    Jun. 9, 2016

(51) Int. Cl.
| | |
|---|---|
| H01P 3/00 | (2006.01) |
| H01L 23/00 | (2006.01) |
| H01L 23/66 | (2006.01) |
| H01L 21/768 | (2006.01) |
| H01L 23/528 | (2006.01) |

(52) U.S. Cl.
CPC ............. *H01P 3/006* (2013.01); *H01L 21/768* (2013.01); *H01L 23/528* (2013.01); *H01L 23/66* (2013.01); *H01L 24/11* (2013.01); *H01L 24/14* (2013.01); *H01P 3/003* (2013.01); *H01L 2223/6605* (2013.01); *H01L 2223/6627* (2013.01)

(58) Field of Classification Search
CPC ........... H01P 3/003; H01P 3/006; H01P 3/082; H01P 3/087
USPC ......................................................... 333/238
See application file for complete search history.

(56) References Cited

U.S. PATENT DOCUMENTS

| | | | |
|---|---|---|---|
| 5,858,622 A | 1/1999 | Gearhart | |
| 6,040,524 A * | 3/2000 | Kobayashi et al. | H05K 1/0219 174/262 |
| 6,518,864 B1 * | 2/2003 | Ito et al. | H01P 3/003 333/238 |
| 7,005,726 B2 * | 2/2006 | Carpentier | H01L 23/522 257/659 |
| 7,548,143 B2 | 6/2009 | Kim et al. | |
| 7,886,434 B1 | 2/2011 | Forman | |
| 2006/0270210 A1 * | 11/2006 | Pruvost et al. | H01P 3/084 438/622 |
| 2009/0134953 A1 | 5/2009 | Hunt et al. | |
| 2012/0068793 A1 | 3/2012 | Chen et al. | |

* cited by examiner

*Primary Examiner* — Benny Lee
(74) *Attorney, Agent, or Firm* — Muncy, Geissler, Olds & Lowe, P.C.

(57) ABSTRACT

In an integrated circuit package that houses radio-frequency (RF) circuits or components using wafer-level packaging (WLP), an RF-signal transmission structure includes a signal-carrying conductive line positioned between grounded conductive lines to avoid undesirable coupling between the signal-carrying conductive line and other RF circuits or components in the same package.

18 Claims, 4 Drawing Sheets

TRANSMISSION LINE IMPLEMENTATION IN WAFER-LEVEL PACKAGING

FIELD OF DISCLOSURE

Various embodiments described herein relate to radio-frequency signal lines, and more particularly, to radio-frequency (RF) signal lines in wafer-level packaging (WLP).

BACKGROUND

Transmission lines have been implemented in various radio-frequency (RF) devices for low-loss flow of signals in mobile communication devices and systems. Large-scale integrated circuits with multiple RF components and circuitry have been designed by integrating such RF components and circuitry as well as various other analog and digital components and circuitry on the same die by using wafer-level packaging (WLP) technology. More recently, high-power RF components such as power amplifiers with multiple operating frequencies have been implemented in packages that also house other RF components as well as transmission lines.

In integrated circuit packages that house high-power RF components such as amplifiers and other RF components, it is often desirable to provide low-loss RF signal lines with strong isolation between different signal paths. In a typical integrated RF package manufactured by using WLP technology, a long RF signal line on the order of 1 mm, for example, have been realized by using a single interconnecting wire. While such a single interconnecting wire may exhibit a low insertion loss, it may be modeled as the equivalent circuit of a series inductor, which exhibits the characteristics of a low-pass filter. As such, when a single interconnecting wire is implemented as a long RF signal line, the wire tends to couple strongly to nearby circuit structures, such as active or passive RF components, thus changing the characteristic impedance of the wire unpredictably. Moreover, due to strong coupling between the single interconnecting wire and nearby circuit structures, the single interconnecting wire may place unwanted signals on other circuitry when RF signals pass through the wire. Furthermore, such a single interconnecting wire may create a mismatch to transmission lines on printed circuit boards (PCBs) that connect input and output signals to the integrated circuit package.

SUMMARY OF THE INVENTION

Exemplary embodiments of the disclosure are directed to a radio-frequency (RF) signal line in wafer-level packaging (WLP) and a method of making the same.

In an embodiment, a device is provided, the device comprising: a ground; a first plurality of conductors coupled to the ground; a second plurality of conductors coupled to the ground; a first conductive line coupled to the first plurality of conductors; a second conductive line coupled to the second plurality of conductors, the second conductive line substantially in parallel with the first conductive line; and a third conductive line positioned between and substantially in parallel with the first conductive line and the second conductive line, the third conductive line having a radio-frequency (RF) signal input and an RF signal output.

In another embodiment, a radio-frequency (RF) circuit is provided, the RF circuit comprising: a ground; a first plurality of conductors coupled to the ground; a second plurality of conductors coupled to the ground; a first conductive line coupled to the first plurality of conductors; a second conductive line coupled to the second plurality of conductors, the second conductive line substantially in parallel with the first conductive line; a third conductive line positioned between and substantially in parallel with the first conductive line and the second conductive line, the third conductive line having an RF signal input and an RF signal output; and at least one RF circuit disposed adjacent the first plurality of conductors, wherein the first conductive line is positioned to provide RF signal isolation between the third conductive line and said at least one RF circuit.

In yet another embodiment, a method of making a device is provided, the method comprising: forming a ground; forming a first plurality of conductors on the ground; forming a second plurality of conductors on the ground; forming a first conductive line coupled to the first plurality of conductors; forming a second conductive line coupled to the second plurality of conductors, the second conductive line substantially in parallel with the first conductive line; and forming a third conductive line positioned between and substantially in parallel with the first conductive line and the second conductive line, the third conductive line having a radio-frequency (RF) signal input and an RF signal output.

BRIEF DESCRIPTION OF THE DRAWINGS

The accompanying drawings are presented to aid in the description of embodiments of the disclosure and are provided solely for illustration of the embodiments and not limitation thereof.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "I" between two adjacent words has the same meaning as "or" unless expressly stated otherwise. Moreover, phrases such as "connected to," "coupled to" or "in communication with" are not limited to direct connections unless expressly stated otherwise.

Figure 1:
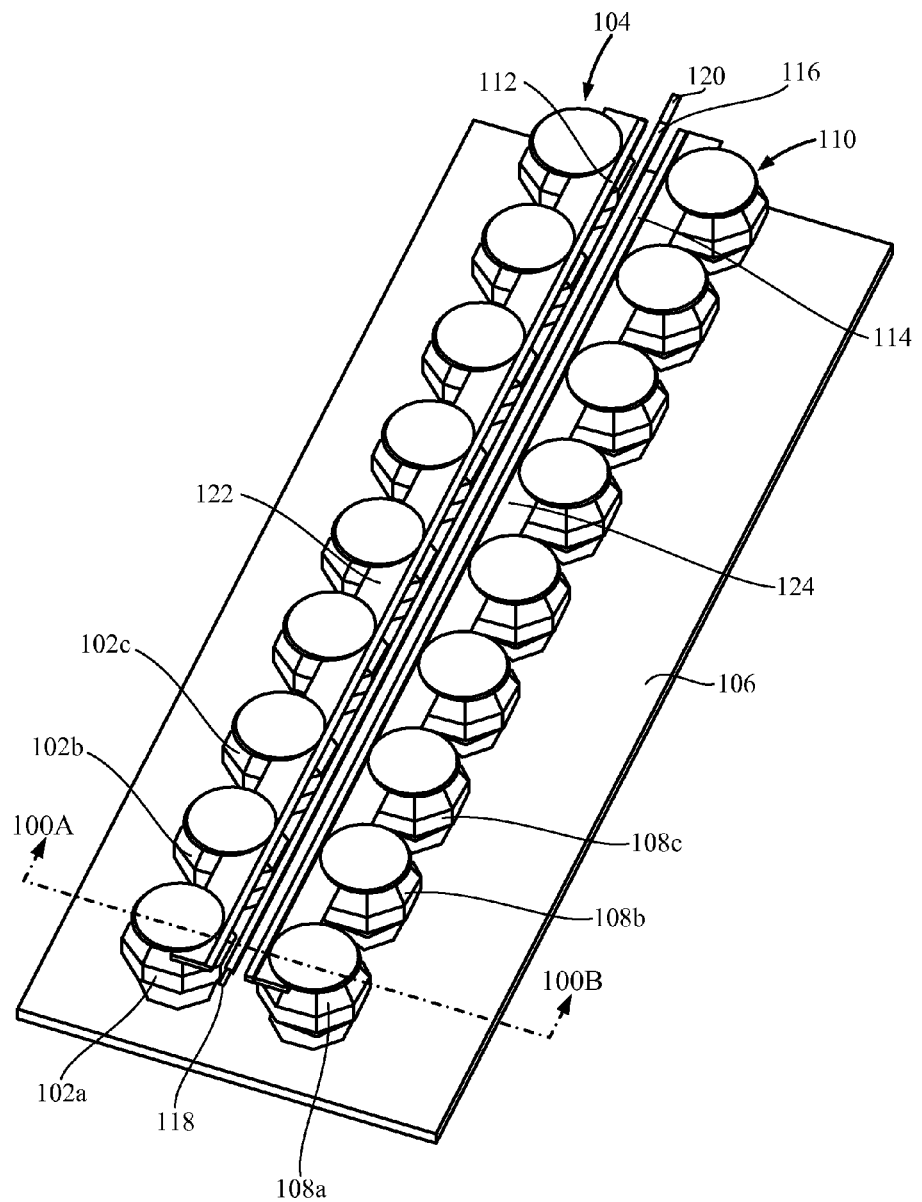
FIG. 1 is a perspective view from above a ground plane of an embodiment of a radio-frequency (RF) device having a signal line in parallel with two grounded conductive lines.

FIG. 1 is a perspective view from above a ground plane of a device having a signal line in parallel with two grounded conductive lines according to an embodiment of the disclosure. In FIG. 1, a first plurality of conductors 102a, 102b, 102c, . . . , which are arranged in a first row 104, are connected to the ground 106. In a similar manner, a second plurality of conductors 108a, 108b, 108c, . . . , which are arranged in a second row 110, are also connected to the ground 106. In an embodiment, the first row 104 of the first plurality of conductors 102a, 102b, 102c, . . . and the second row 110 of the second plurality of conductors 108a, 108b, 108c, . . . are positioned at least substantially in parallel with each other. In an embodiment, a first conductive line 112 is connected to the first row 104 of the first plurality of conductors 102a, 102b, 102c, . . . , whereas a second conductive line 114 is connected to the second row 110 of the second plurality of conductors 108a, 108b, 108c, . . . . Although FIG. 1 illustrates an embodiment in which the first and second conductive lines 112 and 114, which are grounded by the conductors 102a, 102b, 102c, . . . and 108a, 108b, 108c, . . . , respectively, are straight and parallel to each other, they need not be straight lines in an alternate embodiment. For example, the conductive lines may be meandering lines that are substantially in parallel but have one or more turns, such as a 90° turn or a 45° turn on an integrated circuit layout.

In an embodiment, the first conductive line 112 and the second conductive line 114 are positioned at least substantially in parallel with each other. In an embodiment, a third conductive line 116, which is provided as a signal line for conveying radio-frequency (RF) signals, is positioned between the first conductive line 112 and the second conductive line 114. In an embodiment, the third conductive line 116 is positioned at least substantially in parallel with both the first conductive line 112 and the second conductive line 114. As shown in FIG. 1, the third conductive line 116 has an RF signal input 118 and an RF signal output 120. In a further embodiment, a first ground extension strip 122 is coupled between the first plurality of conductors 102a, 102b, 102c, . . . in the first row 104 to provide good grounding for the first conductive line 112, whereas a second ground extension strip 124 is coupled between the second plurality of conductors 108a, 108b, 108c, . . . in the second row 110 to provide good grounding for the second conductive line 114. Although FIG. 1 illustrates an embodiment in which the first, second and third conductive lines 112, 114 and 116 are straight and parallel to one another, they need not be straight lines in an alternate embodiment. For example, the conductive lines may be meandering lines that are substantially in parallel but have one or more turns, such as a 90° turn or a 45° turn on an integrated circuit layout.

Figure 2:
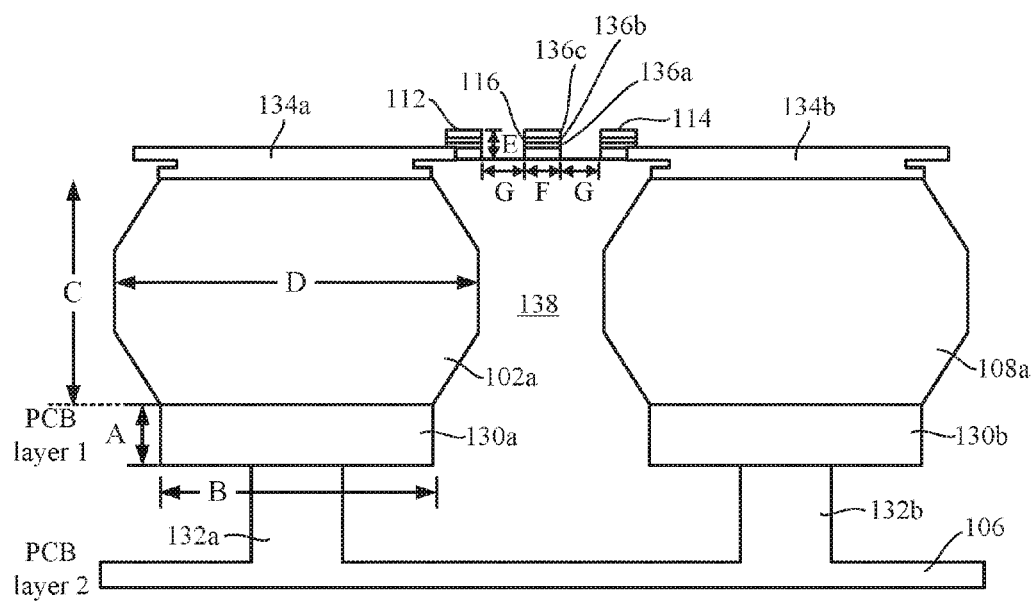
FIG. 2 is a cross-sectional view of the RF device of FIG. 1 taken along sectional line 100A-100B, showing a more detailed embodiment of the structure of the device.

FIG. 2 is a cross-sectional view of the device of FIG. 1 taken along sectional line 100A-100B, showing a more detailed embodiment of the structure of the device in an integrated circuit package. In the embodiment shown in FIG. 2, the ground 106 comprises a ground plane on a printed circuit board (PCB) layer, for example, a grounded conductive backplane on a PCB layer (PCB layer 2). In alternate embodiments, the ground 106 may be any type of grounded conductor and need not be planar. In an embodiment, the first conductor 102a and the second conductor 108a comprise first and second conductive balls, respectively. In a further embodiment, the first and second conductive balls comprise first and second solder balls, respectively. The first and second conductors 102a and 108a need not be spherical in shape. In practice, solder balls implemented as the first and second conductors 102a and 108a may have substantially oval or elliptical cross sections.

In an embodiment, a plurality of solder ball pads may be provided between the ground 106 and the solder balls. For example, in FIG. 2, a first solder ball pad 130a may be provided between the ground 106 and the first conductor 102a in the form of a solder ball, whereas a second solder ball pad 130b may be provided between the ground 106 and the second conductor 108a in the form of a solder ball. In an embodiment, the first and second solder ball pads 130a and 130b may be formed on a metal layer, for example, on a PCB layer (PCB layer 1) different from the PCB layer (PCB layer 2) serving as the ground 106. In a further embodiment, a first conductive connector 132a is provided between the ground 106 and the first solder ball pad 130a, whereas a second conductive connector 132b is provided between the ground 106 and the second solder ball pad 130b. In an embodiment, the first and second conductive connectors 132a and 132b comprise metals through vias between the ground 106 on PCB layer 2 and the first and second solder ball pads 130a and 130b on PCB layer 1.

In an embodiment, a plurality of conductive caps are positioned on the solder balls to provide grounding for the first and second conductive lines 112 and 114. For example, as shown in FIG. 2, a first conductive cap 134a is positioned on the first conductor 102a to provide grounding for the first conductive line 112, whereas a second conductive cap 134b is positioned on the second conductor 108a to provide grounding for the second conductive line 114. In an embodiment, the first and second conductive caps 134a and 134b each comprise a copper cap, for example, a copper cap with an under metallization bump (UMB) structure. In an embodiment, at least a portion of the first conductive line 112 is deposited on the first conductive cap 134a to achieve a direct electrical connection between the first conductive line 112 and the first conductive cap 134a, and at least a portion of the second conductive line 114 is deposited on the second conductive cap 134b to achieve a direct electrical connection between the second conductive line 114 and the second conductive cap 134b.

In an embodiment, the first, second and third conductive lines 112, 114 and 116 each comprise at least one interconnect layer. In the embodiment shown in FIG. 2, the first, second and third conductive lines 112, 114 and 116 each comprise two interconnect layers 136a and 136b stacked with a post-process interconnect (PPI) layer 136c. The interconnect layers 136a and 136b and the PPI layer 136c may be formed, patterned and etched in a conventional manner. Multiple layers of conductors may be provided to form the first, second and third conductive lines 112, 114 and 116 in various manners known to persons skilled in the art. Alternatively, a single layer of metal may be deposited, patterned and etched to form the first, second and third conductive lines 112, 114 and 116. In the embodiment shown in FIG. 2, the third conductive line 116, which is the RF-signal-carrying line, is positioned on a dielectric 138. Also in the embodiment shown in FIG. 2, the first conductive line 112 is partially positioned on the dielectric 138 and partially positioned on the conductive cap 134a, and the second conductive line 114 is also partially positioned on the dielectric 138 and partially positioned on the conductive cap 134b. Alternatively, first and second conductive lines 112 and 114 may be completely positioned on the first and second conductive caps 134a and 134b, respectively.

The structure of the device as shown in the perspective view of FIG. 1 and the cross-sectional view of FIG. 2 includes three conductive lines in parallel, with one signal-carrying conductive line positioned between two grounded conductive lines. Such a structure may be called a coplanar waveguide (CPW). The characteristic impedance of a coplanar waveguide may be described by its inductance and capacitance per unit length as follows:

$$Z = \sqrt{\frac{L}{C}}$$

where Z is the characteristic impedance, L is the inductance per unit length, and C is the capacitance per unit length. By adjusting the inductance and capacitance per unit length, a desired characteristic impedance may be obtained, for example, a characteristic impedance of 50Ω.

In the example shown in FIG. 2, when the device operates at a frequency of 3 GHz and the desired characteristic impedance of the CPW is 50Ω, each of the solder ball pads 130a and 130b may have a thickness A of approximately 51 µm and a width B of approximately 220 µm, and each of the conductors 102a and 108a may have a height C of approximately 180 µm and a width D of approximately 280 µm. Furthermore, each of the first, second and third conductive lines 112, 114 and 116 may have a total height E of approximately 20.775 µm and a width F of approximately 30 µm. The gap G between the first conductive line 112 and the third conductive line 116 and between the second conductive line 114 and the third conductive line 116 may be approximately 34 µm. The dimensions of the various elements may be adjusted to obtain the desired characteristic impedance for the CPW at a given radio frequency. Although an embodiment of a CPW implementation with three parallel conductive lines is shown in FIGS. 1 and 2, other transmission line or waveguide structures may also be implemented in alternate embodiments.

Figure 3:
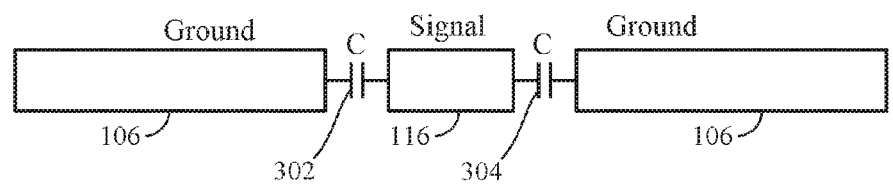
FIG. 3 is a simplified equivalent circuit of the RF device as shown in FIGS. 1 and 2.

FIG. 3 is a simplified equivalent circuit of the structure as shown in FIGS. 1 and 2. In FIG. 3, the signal line 116 is coupled to the ground 106 on both sides of the signal line through two capacitors 302 and 304 each having a capacitance C. In order to create a distributed capacitive effect along the signal line 116, conductors need to be made available in proximity to the signal line 116. In an embodiment, a distributed capacitive effect may be achieved in the structure as shown in FIGS. 1 and 2 by grounding the first plurality of conductors 102a, 102b, 102c, . . . in the first row 104 and the second plurality of conductors 108a, 108b, 108c, . . . in the second row 110, and routing the grounded first and second conductive lines 112 and 114 in close proximity to the signal-carrying third conductive line 116. Other structures may also be implemented to achieve a distributed capacitive effect along the signal-carrying line in alternate embodiments within the scope of the disclosure.

Figure 4:
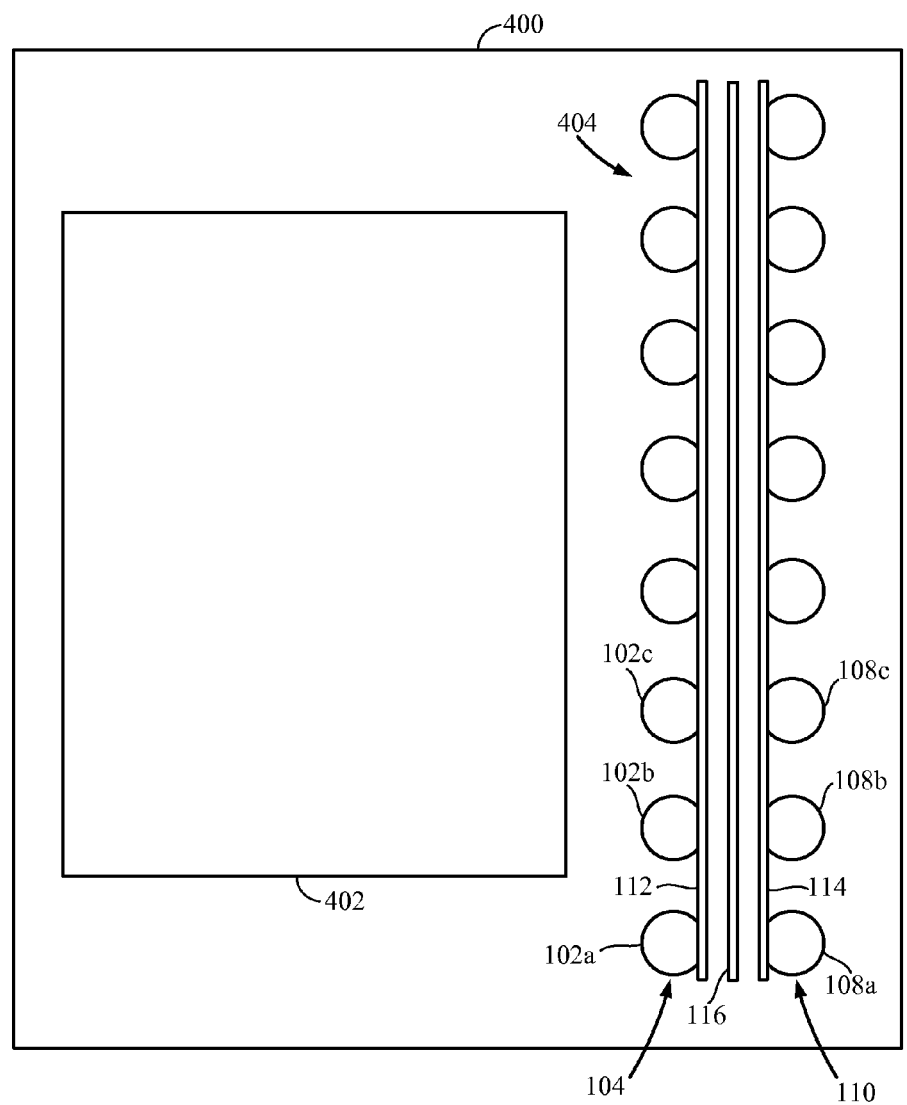
FIG. 4 is a simplified plan view of an RF device in an integrated circuit package.

FIG. 4 is a simplified plan view of an RF integrated circuit device in a package 400 which includes at least one RF circuit 402 and a CPW structure 404, an embodiment of which is shown in FIGS. 1 and 2 and described above. The RF circuit 402 may include one or more passive or active RF components, including one or more high-power RF components such as a power amplifier. In a mobile communication device, the size of the package 400 may be severely limited, and the RF circuit 402 may be placed close to the CPW structure 404. In the embodiment shown in FIG. 4, the CPW structure 404 includes a first conductive line 112 connected to grounded conductors 102a, 102b, 102c, . . . arranged in a first row 104, a second conductive line 114 connected to grounded conductors 108a, 108b, 108c, . . . arranged in a second row 110, and a third conductive line 116 which serves as the RF-signal-carrying line. In an embodiment, the third conductive line 116 is position between and in parallel with the first and second conductive lines 112 and 114. In the embodiment shown in FIG. 4, the first grounded conductive line 112 and the first row 104 of grounded conductors 102a, 102b, 102c, . . . are positioned to provide sufficient isolation between the RF circuit 402 and the RF-signal-carrying line 116. Moreover, The CPW structure 404 as shown in FIG. 4 is capable of providing a very low-loss medium of transmission as well as being highly resilient to unwanted coupling between the RF circuit 402 and the RF-signal-carrying line 116.

Ideally the grounded conductive lines 112 and 114 on both sides of the signal-carrying conductive line 116 are assumed to extend infinitely. In practice, the grounded conductive lines are finite, but if the grounded conductive lines 112 and 114 are of the same width as the signal-carrying conductive line 116, then the structure may be regarded a coplanar strip waveguide (CSW) or coplanar strips. A signal-carrying conductor sandwiched between two grounded conductors may be recognized by persons skilled in the art as a CPW-like transmission line. Although the embodiments illustrated in FIGS. 1-4 and described above include three conductive lines substantially in parallel with one another, two conductive lines instead of three may be implemented in alternate embodiments. In such alternate embodiments, one of the conductive lines may be grounded by solder balls, whereas the other conductive line may serve as an RF signal-carrying line, for example. Although signal isolation from nearby RF signal lines or circuit elements in a transmission line structure with only two conductive lines may not be as good as a CPW or CPW-like structure with two grounded conductive lines sandwiching a signal-carrying line, a transmission line structure with only two conductive lines would require fewer grounded solder balls by eliminating an entire row of them, thus allowing for a reduction in the area of the integrated circuit required for the transmission line structure.

Figure 5:
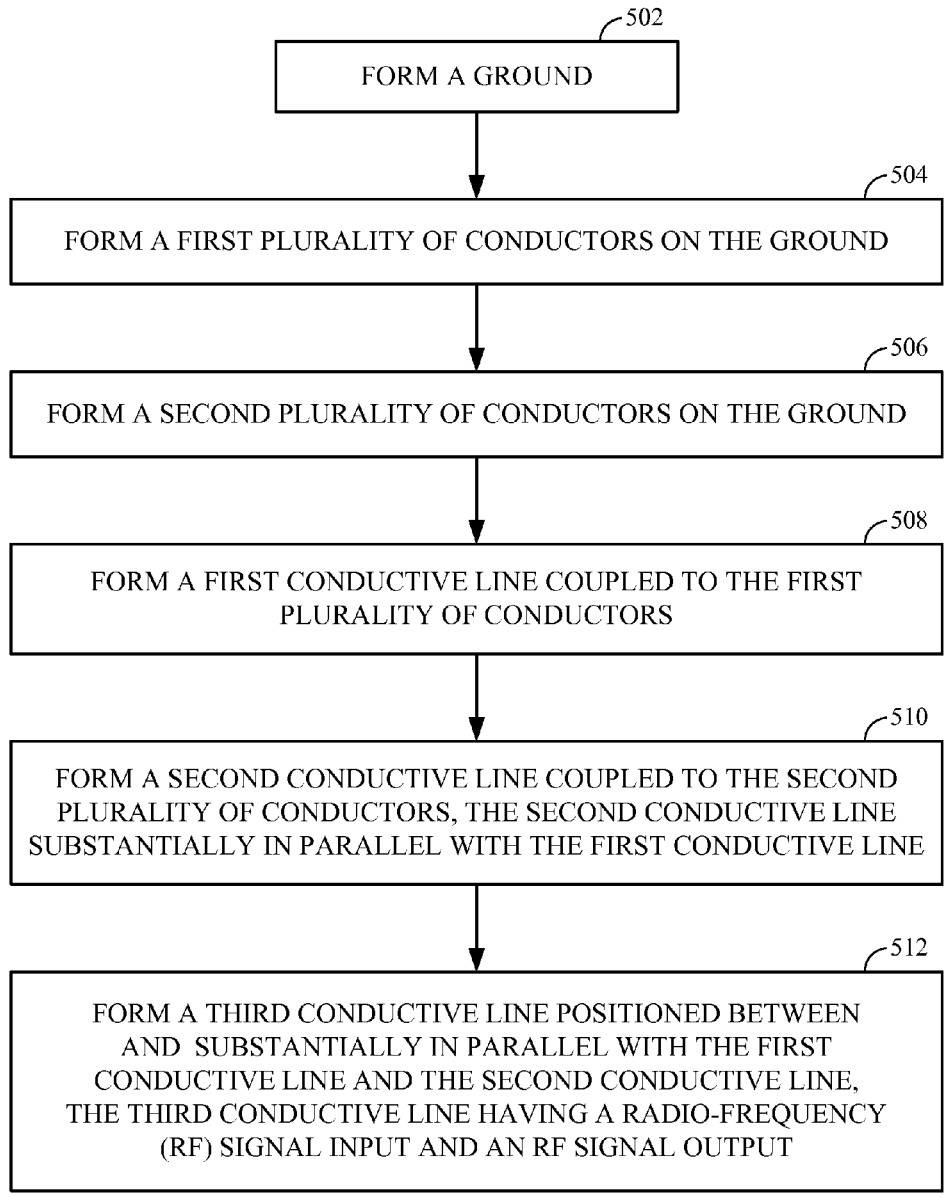
FIG. 5 is a flowchart illustrating an embodiment of a method of making an RF device.

FIG. 5 is a flowchart illustrating an embodiment of a method of making an RF device having a signal-carrying structure described above with reference to FIGS. 1-4. In an embodiment, a ground is formed in step 502. A first row of a first plurality of conductors is formed on the ground in step 504, and a second row of a second plurality of conductors is formed on the ground in step 506. In an embodiment, the first plurality of conductors comprise a first plurality of solder balls coupled to the ground, and the second plurality of conductors comprise a second plurality of solder balls coupled to the ground. In a further embodiment, a first plurality of solder ball pads are formed between the first plurality of solder balls and the ground, and a second plurality of solder ball pads are formed between the second plurality of solder balls and the ground. In yet a further embodiment, a first plurality of conductive caps are formed on the first plurality of conductors, and a second plurality of conductive caps are formed on the second plurality of conductors.

Referring to FIG. 5, a first conductive line is formed in step 508. The first conductive line is electrically coupled to the first plurality of conductors which are grounded. Similarly, a second conductive line is formed in step 510. The second conductive line is electrically coupled to the second plurality of conductors which are grounded, and is positioned at least substantially in parallel with the first conductive line. A third conductive line is formed between the first conductive line and the second conductive line in step 512. The third conductive line, which is the signal-carrying line, is positioned at least substantially in parallel with the first and second conductive lines. The third conductive line has an RF signal input and an RF signal output, whereas both the first and second conductive lines are grounded.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
   a ground;
   a first plurality of conductors coupled to the ground;
   a second plurality of conductors coupled to the ground;
   a first conductive line coupled to the first plurality of conductors;
   a second conductive line coupled to the second plurality of conductors, the second conductive line substantially in parallel with the first conductive line;
   a third conductive line positioned between and substantially in parallel with the first conductive line and the second conductive line, the third conductive line comprising a radio-frequency (RF) signal input and an RF signal output;
   a first plurality of conductive caps coupled between the first plurality of conductors and the first conductive line; and
   a second plurality of conductive caps coupled between the second plurality of conductors and the second conductive line.

2. The device of claim 1,
   wherein the first plurality of conductors comprise a first plurality of conductive balls, and
   wherein the second plurality of conductors comprise a second plurality of conductive balls.

3. The device of claim 2,
   wherein the first plurality of conductive balls comprise a first plurality of solder balls, and
   wherein the second plurality of conductive balls comprise a second plurality of solder balls.

4. The device of claim 3, further comprising:
   a first plurality of solder ball pads coupled between the first plurality of solder balls and the ground; and
   a second plurality of solder ball pads coupled between the second plurality of solder balls and the ground.

5. The device of claim 1, wherein the ground comprises a conductive backplane.

6. The device of claim 1,
   wherein the first plurality of conductive caps comprise a first plurality of copper caps, and
   wherein the second plurality of conductive caps comprise a second plurality of copper caps.

7. The device of claim 1, wherein the first, second and third conductive lines each comprise at least one interconnect layer.

8. The device of claim 7, wherein the first, second and third conductive lines each comprise at least one post-process interconnect (PPI) layer coupled to the at least one interconnect layer.

9. A package, comprising:
   a ground;
   a first plurality of conductors coupled to the ground;
   a second plurality of conductors coupled to the ground;
   a first conductive line coupled to the first plurality of conductors;
   a second conductive line coupled to the second plurality of conductors, the second conductive line substantially in parallel with the first conductive line;
   a third conductive line positioned between and substantially in parallel with the first conductive line and the second conductive line, the third conductive line comprising a radio frequency (RF) signal input and an RF signal output; and
   at least one RF circuit disposed adjacent the first plurality of conductors, wherein the first conductive line is positioned to provide RF signal isolation between the third conductive line and the at least one RF circuit.

10. The package of claim 9, further comprising:
    a first plurality of conductive caps coupled between the first plurality of conductors and the first conductive line; and
    a second plurality of conductive caps coupled between the second plurality of conductors and the second conductive line.

11. The package of claim 9,
    wherein the first plurality of conductors comprise a first plurality of solder balls, and
    wherein the second plurality of conductors comprise a second plurality of solder balls.

12. The package of claim 11, further comprising:
    a first plurality of solder ball pads coupled between the first plurality of solder balls and the ground; and
    a second plurality of solder ball pads coupled between the second plurality of solder balls and the ground.

13. The package of claim 9, wherein the first, second and third conductive lines each comprise at least one interconnect layer.

14. The package of claim 13, wherein the first, second and third conductive lines each comprise at least one post-process interconnect (PPI) layer coupled to the at least one interconnect layer.

15. A method of making a device, comprising:
    forming a ground;
    forming a first plurality of conductors on the ground;
    forming a second plurality of conductors on the ground;
    forming a first conductive line coupled to the first plurality of conductors;
    forming a second conductive line coupled to the second plurality of conductors, the second conductive line substantially in parallel with the first conductive line;
    forming a third conductive line positioned between and substantially in parallel with the first conductive line and the second conductive line, the third conductive line comprising a radio-frequency (RF) signal input and an RF signal output,
forming a first plurality of conductive caps on the first plurality of conductors; and
forming a second plurality of conductive caps on the second plurality of conductors.

16. The method of claim 15, further comprising:
forming a first gap between the first conductive line and the second conductive line; and
forming a second gap between the second conductive line and the third conductive line.

17. The method of claim 15,
wherein forming the first plurality of conductors comprise forming a first row of a first plurality of solder balls on the ground, and
wherein forming the second plurality of conductors comprise forming a second row of a second plurality of solder balls on the ground.

18. The method of claim 17, further comprising:
forming a first plurality of solder ball pads between the first plurality of solder balls and the ground; and
forming a second plurality of solder ball pads between the second plurality of solder balls and the ground.

* * * * *